United States Patent
Ito

(10) Patent No.: US 8,614,637 B2
(45) Date of Patent: Dec. 24, 2013

(54) SEMICONDUCTOR DEVICE HAVING OSCILLATORS, COUNTERS AND COMPARATOR

(75) Inventor: Yoshiaki Ito, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 76 days.

(21) Appl. No.: 13/213,308

(22) Filed: Aug. 19, 2011

(65) Prior Publication Data

US 2012/0050086 A1    Mar. 1, 2012

(30) Foreign Application Priority Data

Aug. 24, 2010 (JP) .................................. 2010-186884
Apr. 12, 2011 (JP) .................................. 2011-087839

(51) Int. Cl.
*H03M 1/12* (2006.01)

(52) U.S. Cl.
USPC ............................................ 341/155; 331/167

(58) Field of Classification Search
USPC ......... 341/155; 331/167, 117 R, 181; 257/75; 438/166
See application file for complete search history.

(56) References Cited

U.S. PATENT DOCUMENTS

| | | | | |
|---|---|---|---|---|
| 3,378,833 A | * | 4/1968 | Anderson ....................... | 341/171 |
| 4,796,028 A | * | 1/1989 | Mackenthun et al. ..... | 340/10.34 |
| 5,134,371 A | * | 7/1992 | Watanabe et al. .............. | 324/252 |
| 7,002,415 B2 | * | 2/2006 | Tsyrganovich ................ | 331/1 R |
| 7,049,867 B2 | * | 5/2006 | Kinugasa et al. ............. | 327/157 |
| 7,221,131 B2 | | 5/2007 | Ozawa et al. | |
| 7,356,423 B2 | * | 4/2008 | Nehrig ............................ | 702/75 |
| 7,639,169 B2 | | 12/2009 | Tanizawa | |
| 2003/0098731 A1 | * | 5/2003 | Tabatabaei et al. ........... | 327/160 |
| 2008/0309542 A1 | | 12/2008 | Tanizawa | |

FOREIGN PATENT DOCUMENTS

| | | |
|---|---|---|
| EP | 1 995 875 A1 | 11/2008 |
| JP | 06-181436 | 6/1994 |
| JP | 06-197465 | 7/1994 |
| JP | 2006-187153 | 7/2006 |
| JP | 2008-312185 | 12/2008 |

OTHER PUBLICATIONS

International Search Report (Application No. PCT/JP2011/068406; PCT13884/14993) Dated Sep. 6, 2011.
Written Opinion (Application No. PCT/JP2011/068406; PCT13884/14993) Dated Sep. 6, 2011.

* cited by examiner

*Primary Examiner* — Peguy Jean Pierre
(74) *Attorney, Agent, or Firm* — Nixon Peabody LLP; Jeffrey L. Costellia

(57) ABSTRACT

An AD converter includes a first oscillator outputting a first frequency in accordance with a reference voltage; a second oscillator outputting a second frequency in accordance with an input voltage; a first counter measuring the first frequency; a second counter measuring the second frequency; and a comparator comparing a measurement result of the first frequency and a measurement result of the second frequency and outputting a digital value in accordance with the input voltage.

13 Claims, 10 Drawing Sheets

1001

1002

1003

1004

SEMICONDUCTOR DEVICE HAVING OSCILLATORS, COUNTERS AND COMPARATOR

TECHNICAL FIELD

The technical field of the present invention relates to a semiconductor device, and particularly relates to an analog-digital converter and an electronic circuit including the analog-digital converter.

BACKGROUND ART

As a circuit that converts an analog signal into a digital signal, an analog-digital converter (also referred to as an AD converter) is used. For the conventional AD converter, successive approximation or the like has been employed (e.g., Patent Document 1).

As an example of an electronic circuit including an AD converter, there is a digitally-controlled power supply circuit. As a power supply circuit, for example, a circuit that converts a given DC voltage into another DC voltage (also referred to as a direct current-direct current converter or a DC-DC converter) is given.

The DC-DC converter includes, for example, a coil, a diode, a transistor, and the like (e.g., Patent Document 2).

REFERENCE

Patent Document

[Patent Document 1] Japanese Published Patent Application No. H6-181436
[Patent Document 2] Japanese Published Patent Application No. H6-197465

DISCLOSURE OF INVENTION

A successive approximation AD converter like that in Patent Document 1 includes an analog circuit such as a sample hold circuit, a voltage comparator, or a digital-analog converter in many cases, which causes increase in circuit size and power consumption. In addition, in order to improve the resolution, the circuit size and the power consumption are further increased.

A DC-DC converter including a successive approximation AD converter has a problem in that the conversion efficiency is decreased due to high power consumption of the AD converter.

In view of the above, an object of one embodiment of the present invention is reduction in circuit size or power consumption in an AD converter and an electronic circuit including the AD converter.

Another object of one embodiment of the present invention is improvement in performance, such as resolution, of the AD converter.

A disclosed semiconductor device includes an AD converter in which an input voltage with an analog value (also referred to as an analog input voltage) is converted into a frequency, the frequency is measured, and a digital value in accordance with the input voltage is output.

Specifically, in the AD converter, an input voltage and a reference voltage that shows a reference range of conversion (also referred to as a reference voltage) are converted into frequencies, the two frequencies are measured (also referred to as "counted"), the measurement results (also referred to as counter values) of the two frequencies are compared, and a digital value obtained by dividing the reference voltage into equal parts is output. The division number is determined in accordance with the resolution of the AD converter.

One embodiment of the present invention is a semiconductor device including a first oscillator outputting a first frequency in accordance with a reference voltage; a second oscillator outputting a second frequency in accordance with an input voltage; a first counter measuring the first frequency; a second counter measuring the second frequency; and a comparator comparing a measurement result of the first frequency and a measurement result of the second frequency and outputting a digital value in accordance with the input voltage.

One embodiment of the present invention is a semiconductor device including a first oscillator outputting a first frequency in accordance with a reference voltage; a second oscillator outputting a second frequency in accordance with an input voltage; a first counter measuring the first frequency up to a predetermined counter value M; a second counter measuring a counter value L of the second frequency in synchronization with the measurement of the first frequency; a comparator comparing the counter value M and the counter value L and outputting a digital value in accordance with the input voltage; and a register controlling the counter value M.

One embodiment of the present invention is a semiconductor device including a conversion circuit comprising and a control circuit. The conversion circuit includes an inductor and a switch element. The control circuit includes a digital integrator and a digital pulse width modulator; and an AD converter. The AD converter includes a first oscillator outputting a first frequency in accordance with a reference voltage; a second oscillator outputting a second frequency in accordance with a feedback voltage from the conversion circuit; a first counter measuring the first frequency; a second counter measuring the second frequency; and a comparator comparing a measurement result of the first frequency and a measurement result of the second frequency and outputting a digital value in accordance with the feedback voltage. In the control circuit, the AD converter outputs the digital value, the digital integrator integrates the digital value and determines a duty value, and the digital pulse width modulator outputs a pulse signal with the duty value. In the conversion circuit, the switch element controls a current flowing in the inductor in accordance with the pulse signal, and an output voltage of the conversion circuit is generated in accordance with the current flowing in the inductor.

In the semiconductor device described above, the second oscillator may be a ring oscillator using the input voltage as a power supply voltage. The first oscillator may be a ring oscillator using the reference voltage as a power supply voltage.

Note that the resolution in this specification indicates the maximum number of divisions in converting the whole range of analog values into digital values, and is expressed in the number of bits of the converted digital value. For example, an AD converter with a resolution of 3 bits can convert an analog voltage that is input to the AD converter into a digital value in eight levels ($2^3=8$) (000 to 111 in the binary).

In addition, the converter may be expressed as a conversion means or a conversion circuit. Similarly, the oscillator may be expressed as an oscillation means or an oscillation circuit, and the integrator may be expressed as an integration means or an integration circuit.

According to one embodiment of the present invention, in the AD converter, only an oscillator is an analog circuit, which leads to reduction in circuit size and power consumption.

Moreover, in a DC-DC converter including the AD converter, reduction in circuit size, reduction in power consumption, or increase in conversion efficiency can be achieved.

BEST MODE FOR CARRYING OUT THE INVENTION

Figure 1A:
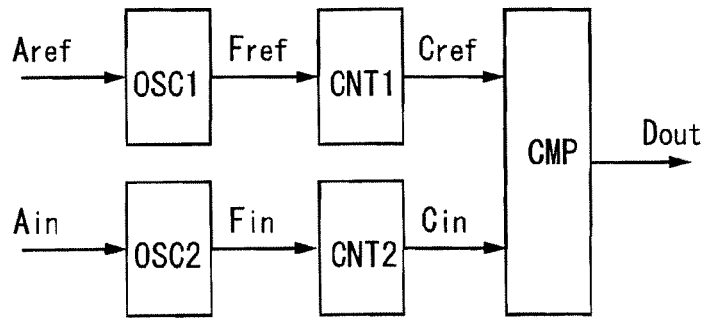
FIG. 1A shows an example of a semiconductor device.

Hereinafter, embodiments of the present invention will be described in detail with reference to the accompanying drawings. However, the present invention is not limited to the following description and it is easily understood by those skilled in the art that the mode and details can be variously changed without departing from the spirit and scope of the present invention. Accordingly, the present invention should not be construed as being limited to the following description of the embodiments. In the drawings for explaining the embodiments, the same parts or parts having a similar function are denoted by the same reference numerals, and description of such parts is not repeated.

Embodiment 1

In this embodiment, as a semiconductor device, an example of a configuration and an example of operation of an AD converter are described.

Figure 1B:
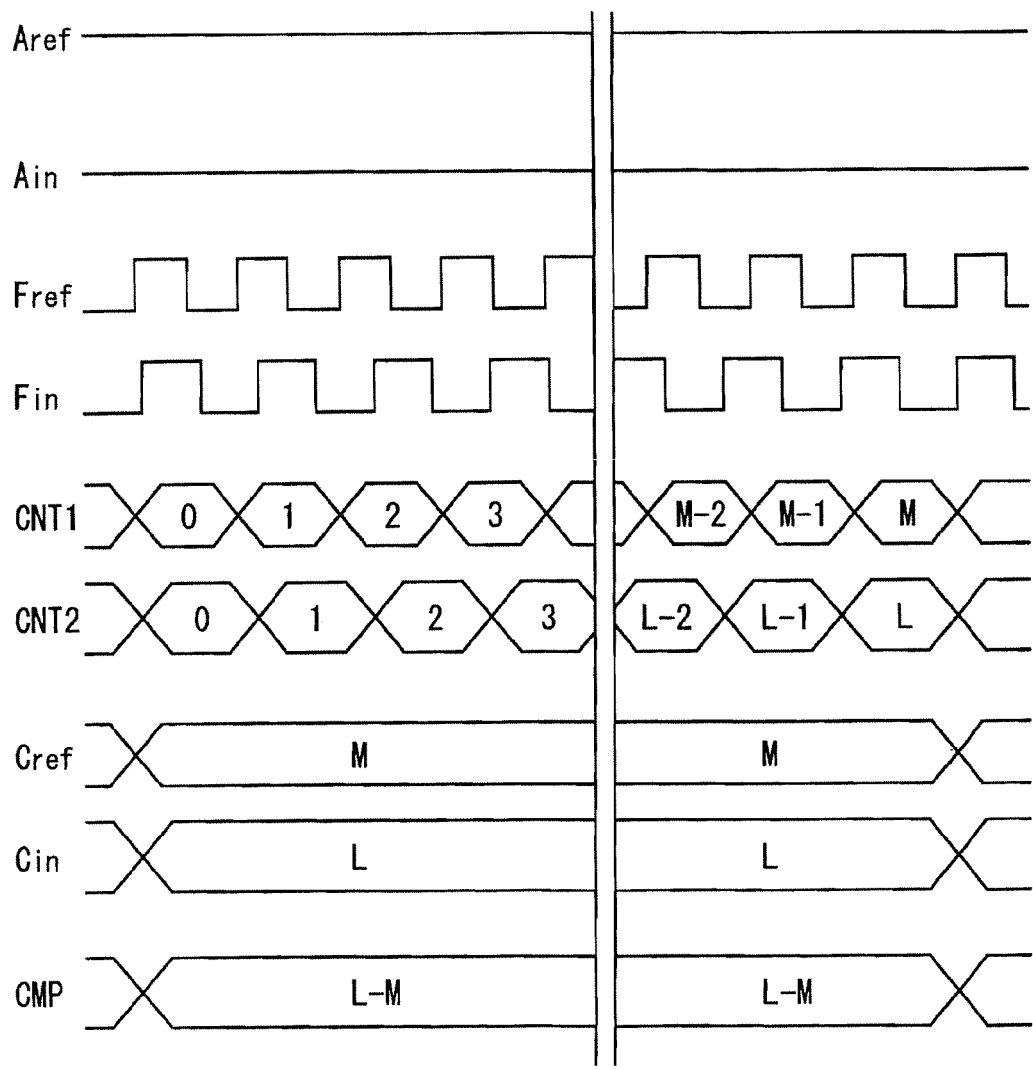
FIG. 1B shows an example of a timing chart.

FIG. 1A is a block diagram of an AD converter, and FIG. 1B is a timing chart showing one cycle of AD conversion.

The AD converter includes an oscillator OSC1, an oscillator OSC2, a counter CNT1, a counter CNT2, and a comparator CMP. The functions of these components are described below.

The oscillator OSC1 outputs a frequency $F_{ref}$ in accordance with a reference voltage $A_{ref}$ as shown in FIG. 1B. That is, the oscillator OSC1 is a circuit (also referred to as a VF converter) which converts an inputted reference voltage $A_{ref}$ into a frequency $F_{ref}$.

The counter CNT1 measures the frequency $F_{ref}$. Specifically, the counter CNT1 measures the number of oscillations (also referred to as the number of pulses) from the oscillator OSC1 up to a predetermined value M, and outputs a counter value ($C_{ref}$=M) as the measurement result.

On the other hand, the oscillator OSC2 outputs a frequency $F_{in}$ in accordance with an input voltage $A_{in}$ as shown in FIG. 1B. That is, the oscillator circuit OSC2 is a circuit which converts an inputted input voltage $A_{in}$ into the frequency $F_{in}$.

The counter CNT2 measures the frequency $F_{in}$. Specifically, the counter CNT2 measures the number of oscillations from the oscillator OSC2, and outputs a counter value ($C_{in}$=L) as the measurement result. The measurement by the counter CNT2 is performed in the same period when the measurement by the counter CNT1 is performed. In other words, measurements are performed in synchronization between the counter CNT1 and the counter CNT2.

The comparator CMP compares the measurement results output from the two counters (the counter value ($C_{ref}$=M) and the counter value ($C_{in}$=L)), and outputs a digital value in accordance with the input voltage $A_{in}$, as shown in FIG. 1B. Specifically, the comparator CMP detects a difference (L−M) between the counter value ($C_{ref}$=M) and the counter value ($C_{in}$=L) using the counter value ($C_{ref}$=M) as a reference, and outputs the digital value $D_{out}$ in accordance with the input voltage $A_{in}$.

For example, an AD converter with a resolution of 3 bits can output the digital value $D_{out}$ in eight different levels (000 to 111 in the binary). Note that the resolution is not limited to 3 bits.

In the above manner, analog-digital conversion (also referred to as AD conversion) can be performed.

In the AD converter of this embodiment, only the oscillators are analog circuits, which leads to reduction in circuit size and power consumption.

Further, since an input voltage is converted into a frequency, a digital value can be easily obtained by measurement of the frequency.

An example of a specific configuration of each circuit is described below.

Figure 2A:
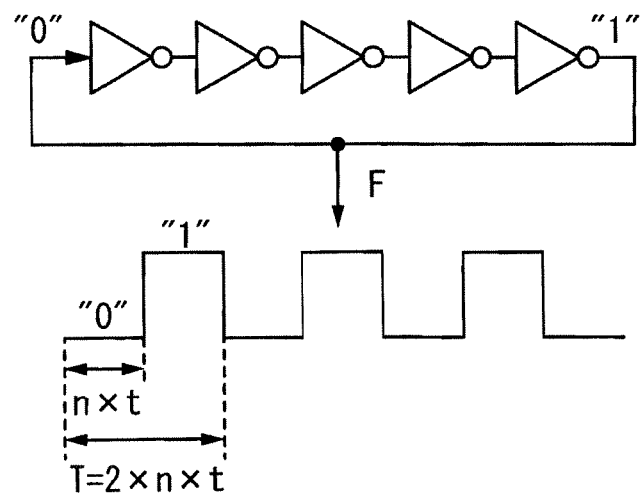
FIGS. 2A and 2B show an example of a semiconductor device.
Figure 2B:
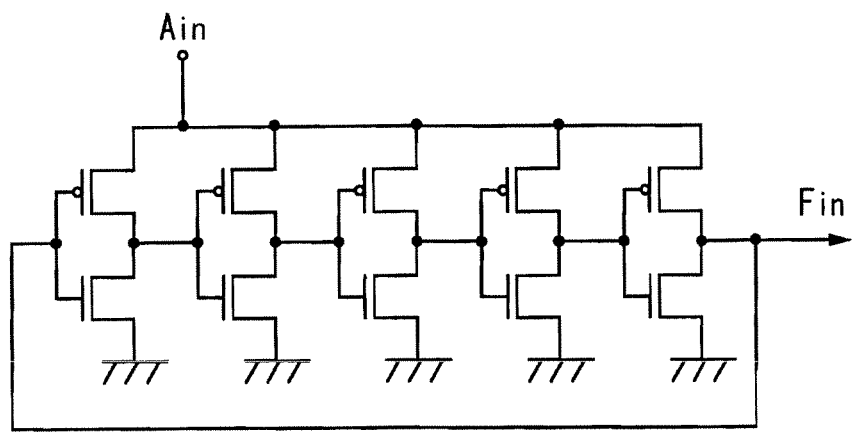

FIGS. 2A and 2B show an example of the oscillator OCS2, and a ring oscillator that converts the input voltage $A_{in}$ into the frequency $F_{in}$ is shown.

A ring oscillator includes an odd number of inverters (n inverters) connected in a chain. FIG. 2B shows an example of a specific configuration of a ring oscillator. As each inverter, a CMOS inverter in which transistors having different polarities are connected in series can be used.

The odd number of inverters produces logical negation, which is the reverse of input, as a whole. Each inverter has a delay time t. When a delay time (n×t) has passed since input (e.g., "0") into an inverter of a first stage, an inverter of a last stage outputs logical negation (e.g., "1") of the first stage input, and then the output is input into the inverter of the first stage again. These operations are repeated, so that an oscillation is performed.

As in FIG. 2A, a period T of the ring oscillator is 2×n×t, i.e. T=2×n×t, and a frequency F of the ring oscillator is 1/(2×n×t), i.e. F=1/(2×n×t).

According to the formula, the frequency F of the ring oscillator decreases as the delay time t of each inverter increases.

The delay time t of each inverter is shortened as power supply voltage applied to each inverter is increased. This is because when the power supply voltage is increased, a period of time taken until a gate of a transistor becomes saturated is shortened, so that operation speed of each inverter is increased.

As a result, the frequency F increases as the power supply voltage increases. Therefore, the ring oscillator oscillates with the frequency F in accordance with the power supply voltage.

As in FIG. 2B, the input voltage $A_{in}$ is input as the power supply voltage of each inverter, and thus the ring oscillator can oscillate with the frequency $F_{in}$ in accordance with the input voltage $A_{in}$.

In the above manner, the oscillator OSC2 outputs the frequency $F_{in}$ in accordance with the input voltage $A_{in}$. With use of a ring oscillator as the oscillator OSC2, the circuit size can be reduced.

It is also effective to use a ring oscillator like that shown in FIGS. 2A and 2B as the oscillator OSC1. The oscillator OSC1 can oscillate with a frequency $F_{ref}$ in accordance with a reference voltage $A_{ref}$ by input of the reference voltage $A_{ref}$ as the power supply voltage of each inverter.

Rng oscillators are used for both the oscillator OSC1 and the oscillator OSC2, whereby AD conversion can be performed accurately.

The counter CNT1 and the counter CNT2 each include a plurality of flip flops. The number of flip flops may be determined depending on the resolution of the AD converter. For example, in the case of an AD converter with a resolution of N bits, N flip flops may be provided. Note that with use of asynchronous counters for both the counter CNT1 and the counter CNT2, high operation can be achieved.

The comparator CMP is a circuit that detects a difference between the counter value ($C_{ref}$=M) and the counter value ($C_{in}$=L), and a divider or the like can be used.

This embodiment can be implemented in combination with any of the other embodiments as appropriate.

Embodiment 2

In this embodiment, another example of an AD converter is described.

Figure 3A:
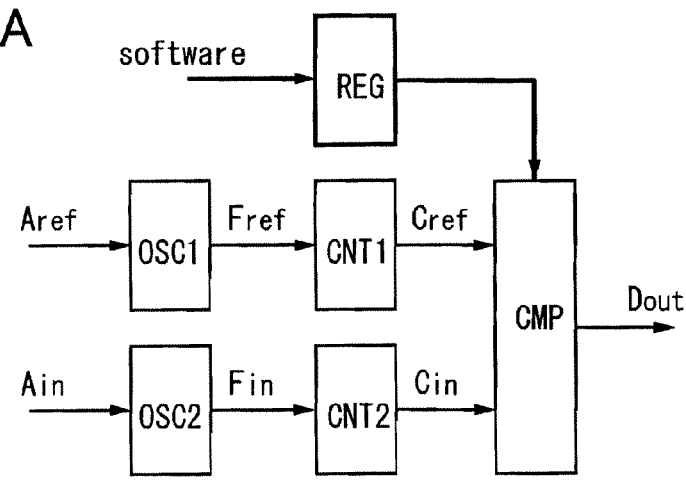
FIG. 3A shows an example of a semiconductor device.
Figure 3B:
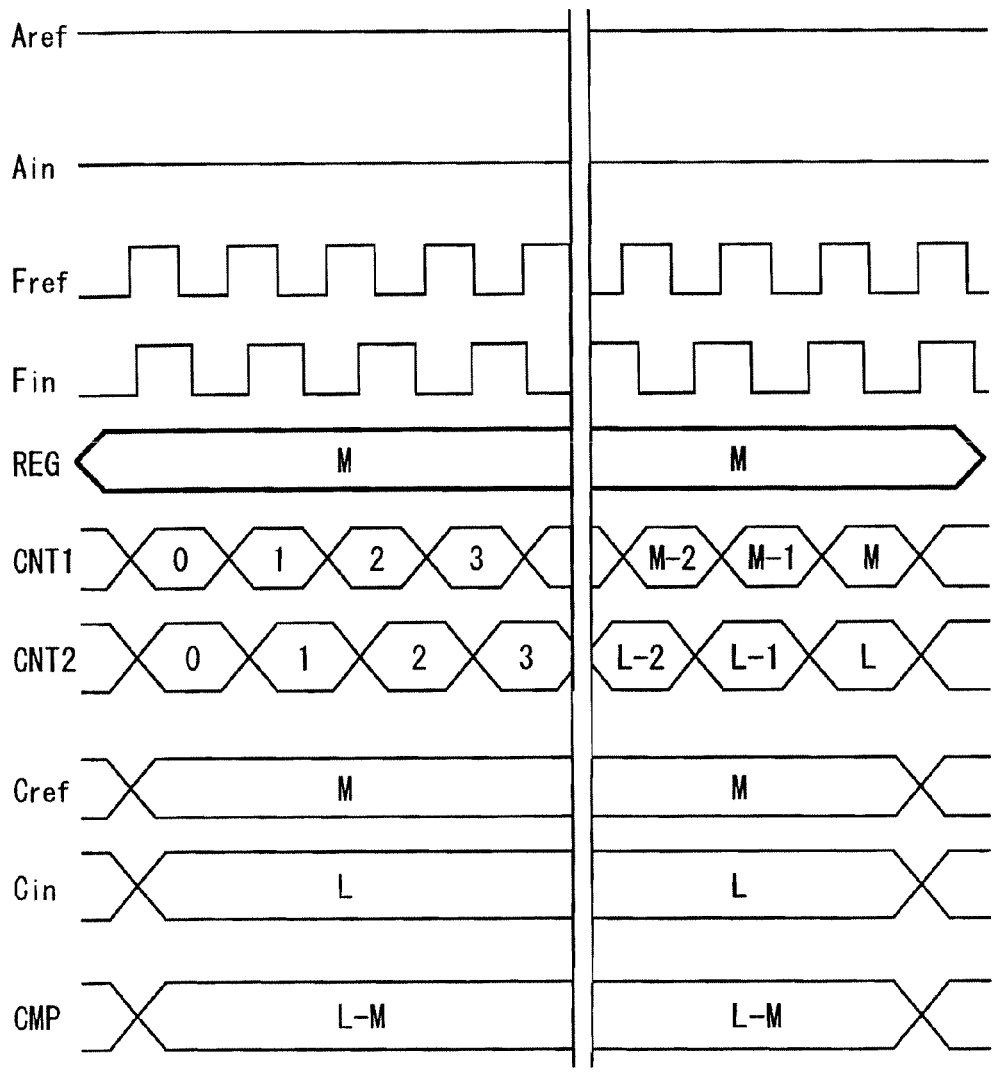
FIG. 3B shows an example of a timing chart.

FIG. 3A shows a configuration in which the measurement result of the counter CNT1 in the AD converter in FIGS. 1A and 1B can be changed. That is, the counter value $C_{ref}$ of the frequency $F_{ref}$ in accordance with the reference voltage $A_{ref}$ is controlled. Further, FIG. 3B shows a timing chart of one cycle of AD conversion.

The AD converter in FIG. 3A includes a register REG which stores data. The register REG includes a plurality of flip flops. The number of flip flops corresponds to the number of bits of data that can be stored, and may be determined depending on the resolution of the AD converter. The register REG has the following functions.

The register REG is connected to the comparator CMP, and controls the counter value $C_{ref}$ of the frequency $F_{ref}$. In the case where measurement is performed up to a desired counter value ($C_{ref}$=M), a value M is written into the register REG as shown in FIG. 3B.

For example, in the case of an AD converter with a resolution of 3 bits, the counter CNT1 can measure a counter value ($C_{ref}$=0 to 7). A value (M=5) (101 in the binary) is written into the register REG, so that the counter CNT1 measures the frequency $F_{ref}$ up to a counter value (M=5). Note that measurement in the counter CNT2 is performed at the same period as that in the counter CNT1. The counter value ($C_{in}$=L) of the counter CNT2 is set to 0 to 5 in accordance with the frequency $F_{in}$.

A difference between the counter value ($C_{ref}$=M=5) and the counter value ($C_{in}$=L) is 0 to 5, so that the AD converter can output the digital value $D_{out}$ in six different levels.

In such a manner, the counter value $C_{ref}$ is changed by the value M written into the register REG so that the number of divisions is controlled; thus, the accuracy of AD conversion (also referred to as an error of AD conversion) can be adjusted.

The accuracy can be increased by increasing the value M written into the register REG, and the accuracy can be decreased by decreasing the value M. That is, the accuracy of AD conversion can be adjusted depending on the application.

Note that the writing into the register REG can be performed by software processing or the like from the outside, as shown in FIG. 3A.

Figure 4A:
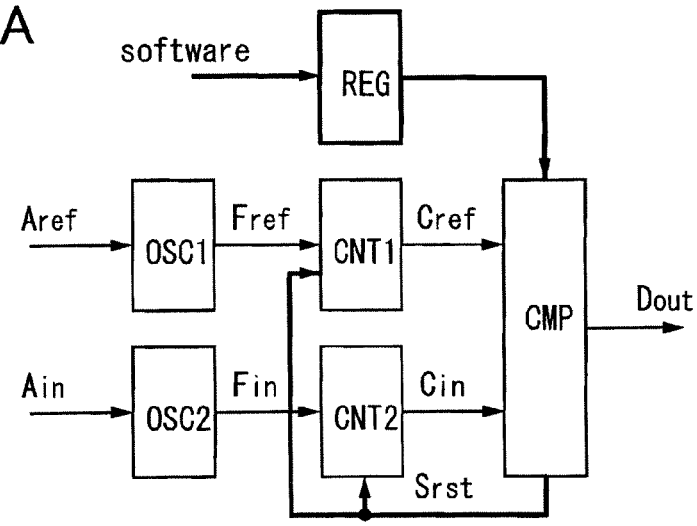
FIG. 4A shows an example of a semiconductor device.

The comparator CMP may output a signal that resets the counter CNT1 and the counter CNT2 (also referred to as a reset signal $S_{rst}$) as shown in FIG. 4A.

Figure 4B:
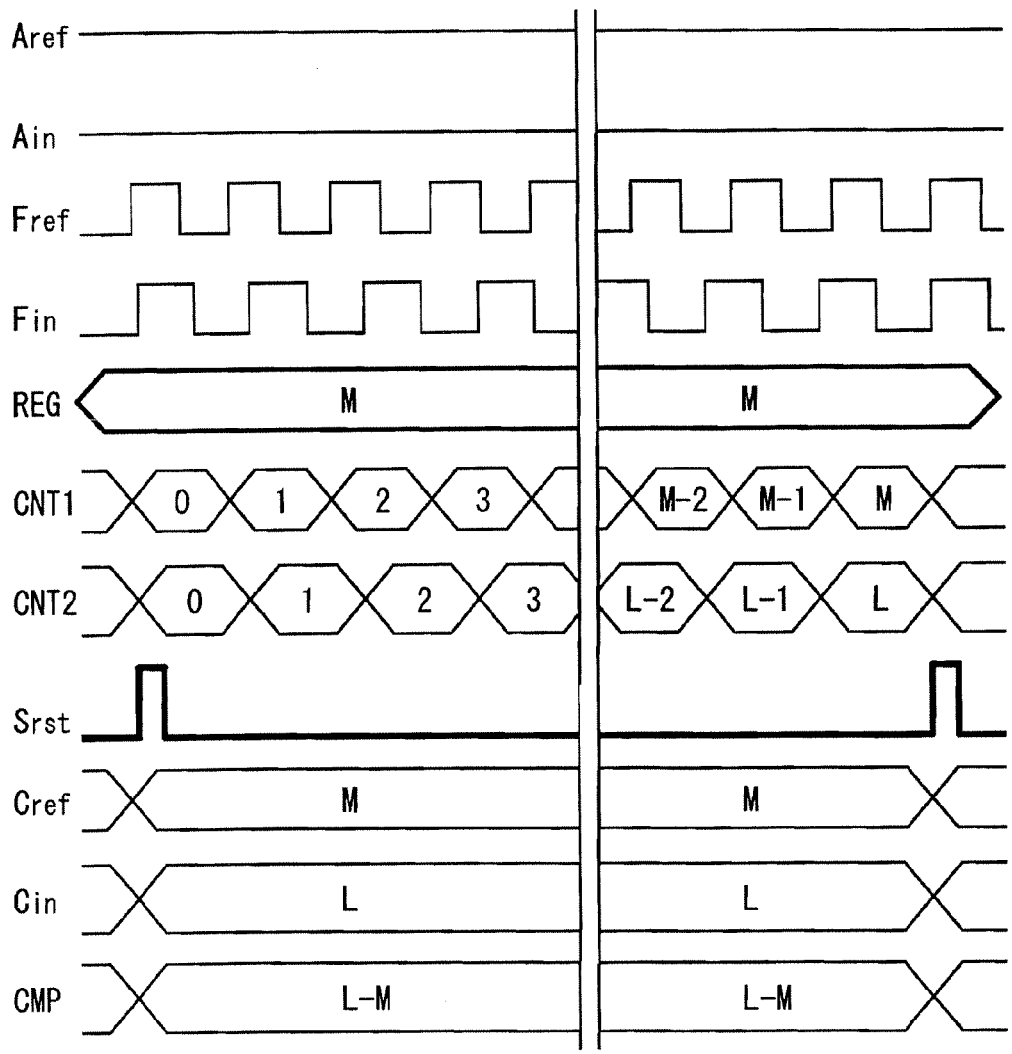
FIG. 4B shows an example of a timing chart.

Specifically, the comparator CMP outputs the reset signal $S_{rst}$ when the counter CNT1 has performed measurement up to the counter value M written into the register REG as shown in FIG. 4B. Then, the two counters are reset by the reset signal $S_{rst}$, and measurement starts again. With this configuration, AD conversion can be repeated.

This embodiment can be implemented in combination with any of the other embodiments as appropriate.

Embodiment 3

In this embodiment, an example of an electronic circuit including the above-described AD converter is described as a semiconductor device.

Figure 5A:
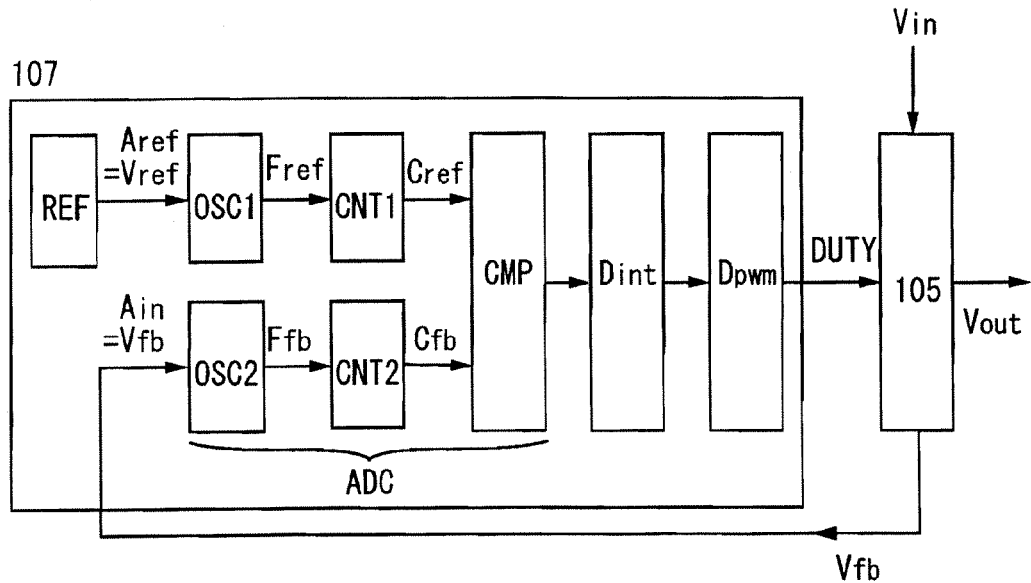
FIGS. 5A to 5C show examples of semiconductor devices.

FIG. 5A is a block diagram of a digitally-controlled DC-DC converter.

The DC-DC converter includes a conversion circuit 105 and a control circuit 107. The DC-DC converter is a circuit that generates an output voltage $V_{out}$ by direct conversion of an input voltage $V_{in}$.

Figure 5B:
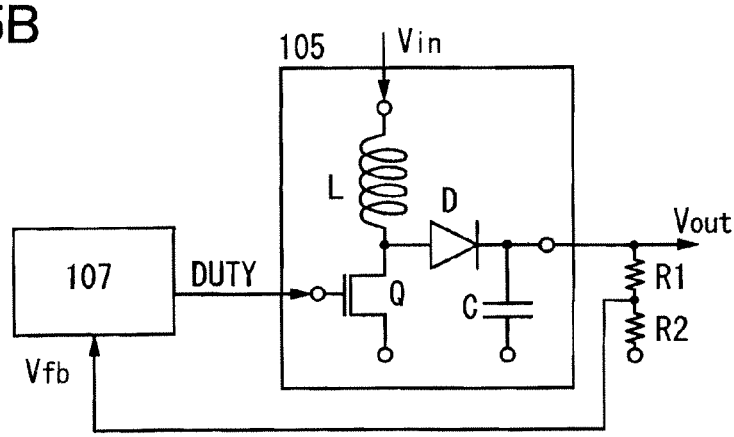
Figure 5C:
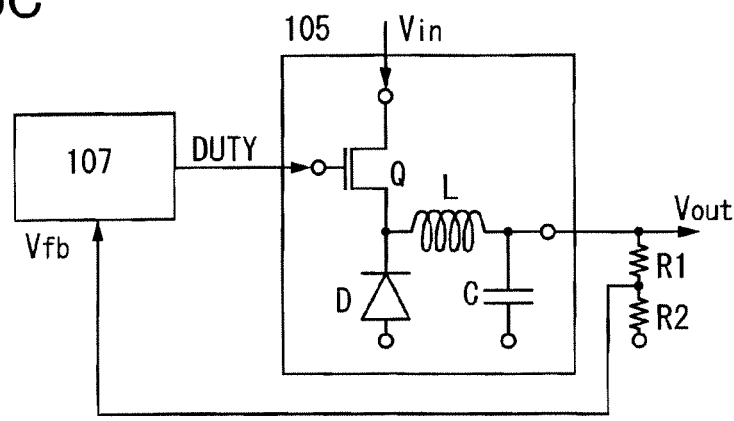

FIGS. 5B and 5C show examples of the conversion circuit 105. FIG. 5B shows a step-up circuit ($V_{in}$<$V_{out}$), and FIG. 5C shows a step-down circuit ($V_{in}$>$V_{out}$).

The conversion circuit 105 includes at least a switch element Q and an inductor L.

The switch element Q is a transistor, for example. Current flows in the inductor L is controlled by switching between an on-state (a conduction state) and an off-state (a non-conduction state). Note that the state of the switch element Q is determined by a pulse signal generated in the control circuit 107.

The inductor L is a coil, for example. The inductor L generates electromotive force in accordance with the current flowing therethrough so that the output voltage $V_{out}$ of the conversion circuit 105 (also referred to as an output voltage of the DC-DC converter) is generated. Note that the current value is determined by the value of the input voltage $V_{in}$ or the like. In such a manner, the input voltage $V_{in}$ can be converted into the output voltage $V_{out}$.

Next, specific configuration and operation of the conversion circuit 105 are described. The case of using a circuit in FIG. 5B is described.

The conversion circuit 105 in FIG. 5B includes the switch element Q, the inductor L, a diode D, and a capacitor C. Note that a transistor is shown as the switch element Q, and a coil is shown as the inductor L. The components have connection relations and functions described below.

A gate of the switch element Q is electrically connected to the control circuit 107. One of a source and a drain of the switch element Q is electrically connected to one terminal of the inductor L and an anode of the diode D. The other terminal of the inductor L is electrically connected to an input terminal. A cathode of the diode D is electrically connected to one terminal of the capacitor C and an output terminal.

The other of the source and the drain of the switch element Q and the other terminal of the capacitor C are electrically connected to a wiring to which a predetermined potential is input. Here, the predetermined potential is a ground potential, for example.

Note that FIG. 5B shows the example in which the diode D is used for rectification and the capacitor C is used for smoothing; this embodiment is not limited to using these components.

The conversion circuit 105 has two operations corresponding to the on state and the off state of the switch element Q. The conversion circuit 105 steps up the input voltage $V_{in}$ by alternately repeating the two operations.

First, in the case where the switch element Q is on, the inductor L generates electromotive force in accordance with current flowing therethrough. The current value is determined by the input voltage $V_{in}$ or the like.

Then, in the case where the switch element Q is off, the inductor L generates reverse electromotive force so as to maintain the current. The input voltage $V_{in}$ is added to the electromotive force generated at this time, and (the output voltage $V_{out}=\alpha V_{in}$) is obtained.

Here, $\alpha$ is determined by the ratio of an on-state period to one switching cycle (an on-state period $T_{on}$+an off-state period $T_{off}$) of the switch element Q, that is, by a duty value DUTY $(=T_{on}/(T_{on}+T_{off}))$, where 0<DUTY<1). In the case of using the step-up circuit, the input voltage $V_{in}$ is stepped up with $\alpha=1/(1-DUTY)>1$.

Then, the output voltage $V_{out}$ of the conversion circuit 105 is fed back to the control circuit 107. That is, a feedback voltage $V_{fb}$, in accordance with the output voltage $V_{out}$ is input into the control circuit 107.

FIG. 5B shows as an example in which a feedback voltage $V_{fb}=V_{out}\times R_2/(R_1+R_2)$ is generated by a resistance $R_1$ and a resistance $R_2$ which are electrically connected to the output terminal of the conversion circuit 105, and the feedback voltage is input to the control circuit 107.

Note that one terminal of the resistance $R_1$ is electrically connected to the output terminal of the conversion circuit 105, and the other terminal of the resistance $R_1$ is electrically connected to one terminal of the resistance $R_2$ and the control circuit 107. The other terminal of the resistance $R_2$ is electrically connected to a wiring to which a ground potential is input, for example.

The control circuit 107 controls the duty value DUTY so that the feedback voltage $V_{fb}$ has the same value as a predetermined voltage (also referred to as a reference voltage $V_{ref}$. As a result, the output voltage $V_{out}=V_{ref}\times(1+R_1/R_2)$ is satisfied. That is, the output voltage $V_{out}$ is proportional to the reference voltage $V_{ref}$.

Note that in the case of using the step-down circuit shown in FIG. 5C, similarly, the switch element Q is controlled in accordance with the duty value DUTY, so that (the output voltage $V_{out}=\alpha V_{in}$ is obtained. In the case of using the step-down circuit, the input voltage $V_{in}$ is stepped down when 0<$\alpha$=DUTY<1.

As a transistor applicable to the switch element Q, a thin film transistor, a power MOSFET, or the like can be used, and a p-channel transistor or an n-channel transistor can be used as appropriate. The transistor may have a top-gate structure or a bottom-gate structure. Moreover, the transistor may have a channel-etch structure or a channel-stop structure.

For a semiconductor material of the transistor, a silicon semiconductor such as silicon or silicon germanium, an oxide semiconductor, an organic semiconductor, a compound semiconductor, or the like can be used. Note that an amorphous semiconductor, a polycrystalline semiconductor, a microcrystalline semiconductor, a single-crystal semiconductor, or the like can be used.

Next, a specific configuration and operation of the control circuit 107 are described.

The control circuit 107 includes, as in FIG. 5A, a reference voltage generator REF, an AD converter ADC, a digital integrator $D_{int}$, and a digital pulse width modulator $D_{pwm}$. Note that the digital pulse width modulator $D_{pwm}$ is also referred to as a digital PWM. Further, the reference voltage generator REF may be connected to the control circuit 107 from the outside.

The configuration described in Embodiment 1 and Embodiment 2 can be employed for the AD converter ADC. Although not shown in FIG. 5A, the register REG may be used as in FIGS. 3A and 313 and FIGS. 4A and 413. For the digital integrator $D_{int}$ and the digital pulse width modulator $D_{pwm}$ known configurations can be employed.

Figure 6:
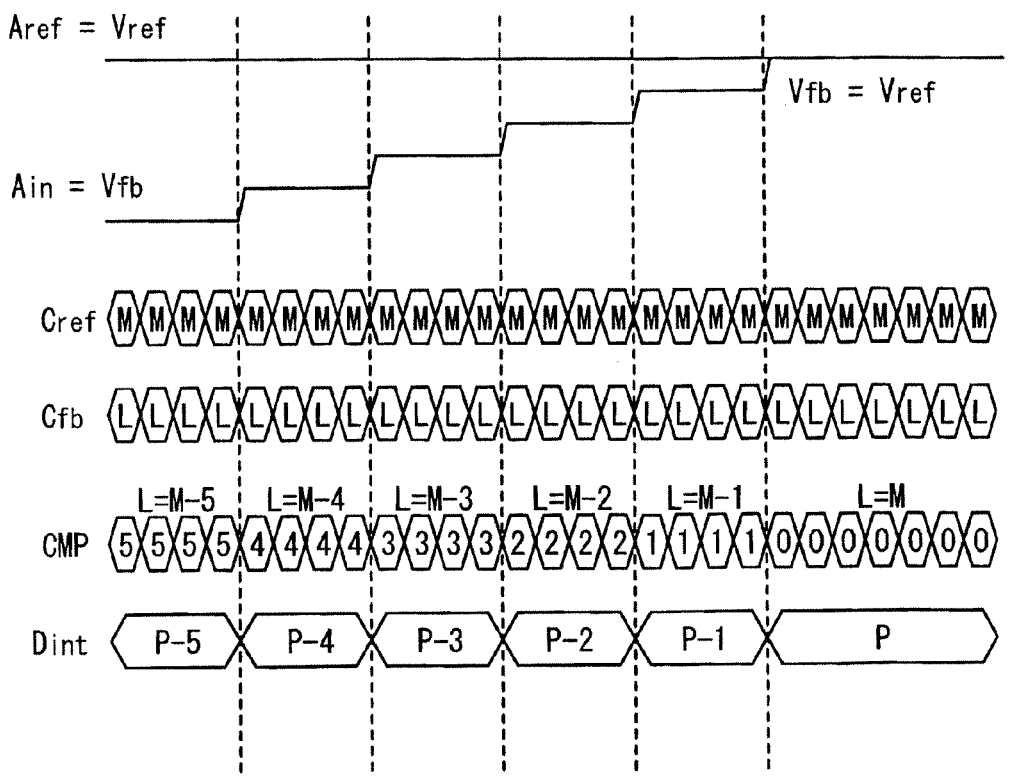
FIG. 6 shows an example of a timing chart.
Figure 7A:
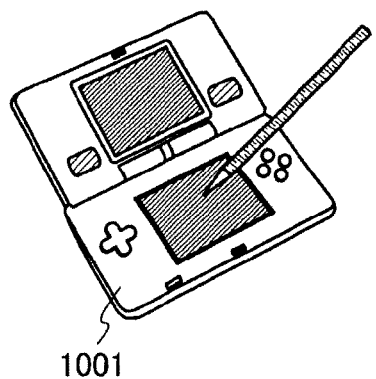
FIGS. 7A to 7D each show an example of an electronic device.
Figure 7B:
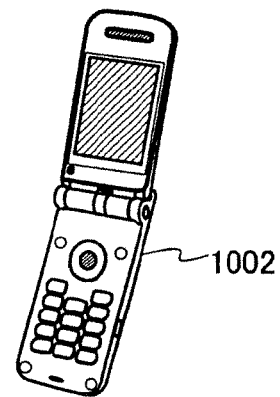
Figure 7C:
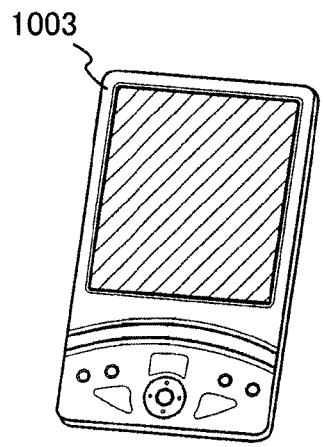
Figure 7D:
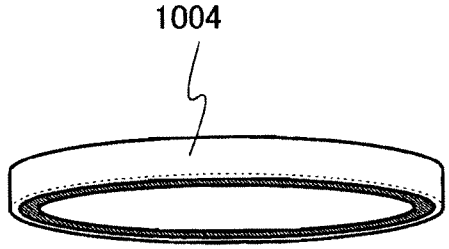

FIG. 6 is a timing chart of the control circuit 107. First, as the input voltage $A_{in}$ of the AD converter ADC, the feedback voltage $V_{fb}$ of the conversion circuit 105 is input. Further, as the reference voltage $A_{ref}$ of the AD converter ADC, the reference voltage $V_{ref}$ from the reference voltage generator REF is input.

FIG. 6 shows an example in which the feedback voltage $V_{fb}$ changes to have the same value as the reference voltage $V_{ref}$. The AD converter ADC, the digital integrator $D_{int}$, and the digital pulse width modulator $D_{pwm}$ have functions described below.

The AD converter ADC has a configuration similar to that in the above embodiment. The AD converter ADC compares the counter value $(C_{ref}=M)$ of the frequency $F_{ref}$ in accordance with the reference voltage $V_{ref}$ and the counter value $(C_{fb}=L)$ of the frequency $F_{fb}$ in accordance with the feedback voltage $V_{fb}$, detects a difference between the two counter values (L−M), and thus outputs a digital value in accordance with the feedback voltage $V_{fb}$.

The digital integrator $D_{int}$ integrates the digital value, and outputs an integral value. For example, when the difference (L−M) is −5, the digital integrator $D_{int}$ outputs an integral value (P−5) obtained by integrating the corresponding digital value. Then, the duty value DUTY is determined in accordance with the integral value.

The digital pulse width modulator $D_{pwm}$ outputs a pulse signal (also referred to as a PWM signal) with the duty value DUTY. That is, a period of the pulse signal is determined in accordance with the integral value that is input.

After that, the conversion circuit 105 generates the output voltage $V_{out}$ in accordance with the pulse signal, and feeds the output voltage $V_{out}$ back to the control circuit 107.

In this manner, AD conversion, control of the duty value DUTY, and feedback are repeated, and the feedback voltage $V_{fb}$ changes to have the same value as the reference voltage $V_{ref}$.

When $V_{fb}=V_{ref}$, in other words, the difference between the two counter values (L−M) in the AD converter ADC is 0 and the integral value P is output, the DC-DC converter is locked (the DC-DC converter is in a lock state) and the output voltage $V_{out}$ is determined. That is, the output voltage $V_{out}$ is generated so that $V_{out}=V_{ref}\times(1+R_1R_2)$.

As described above, direct-current conversion is performed.

In the AD converter of this embodiment, only the oscillators are analog circuits, which leads to reduction in circuit size and power consumption.

Therefore, also in terms of the whole DC-DC converter, the circuit size and the power consumption can be reduced.

In addition, reduction in power consumption of the AD converter leads to improvement in conversion efficiency of the DC-DC converter.

Note that in the direct-current conversion, it takes time from the change in the duty value DUTY to completion of the change in the output voltage $V_{out}$. In other words, in FIG. 6, it takes time for the $V_{fb}$ to change from some value to a value equal to that of $V_{ref}$.

The period of time from the change in the duty value DUTY to completion of the change in the output voltage $V_{out}$ depends on time needed for the AD conversion. Further, the time needed for the AD conversion depends on measurement time of the counter value $C_{ref}$.

Accordingly, as described in Embodiment 2, the time needed for the AD conversion can be adjusted by controlling the counter value $C_{ref}$ by the register REG. For example, the value M written into the register REG is set to be small so that the measurement time of the counter value $C_{ref}$ is shortened; thus, the time needed for the AD conversion can be shortened. As a result, the time needed for the direct-current conversion is shortened.

This embodiment can be implemented in combination with any of the other embodiments as appropriate.

Embodiment 4

With use of the AD converter according to one embodiment of the present invention or an electronic circuit including the AD converter (e.g., a DC-DC converter), electronic devices with small size and less power consumption can be provided.

Examples of the electronic devices include display devices, laptop personal computers, image reproducing devices provided with recording media (typically, devices which reproduce the content of recording media such as digital versatile discs (DVDs) and have displays for displaying the reproduced images), mobile phones, portable game machines, personal digital assistants, e-book readers, video cameras, digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and lighting devices. Specific examples of these electronic devices are shown in FIGS. 7A to 7D, FIGS. 8A and 8B, and FIG. 9.

FIGS. 7A, 7B, 7C, and 7D show examples of a portable game machine, a mobile phone, a personal digital assistant, and a lighting device, respectively. The AD converter according to one embodiment of the present invention or an electronic circuit including the AD converter is included in housings 1001 to 1004, whereby reduction in size and power consumption of the electronic devices can be achieved.

Figure 8A:
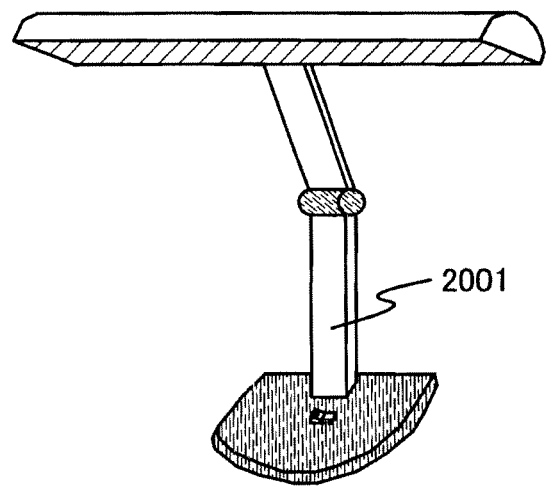
FIGS. 8A and 8B each show an example of an electronic device.
Figure 8B:
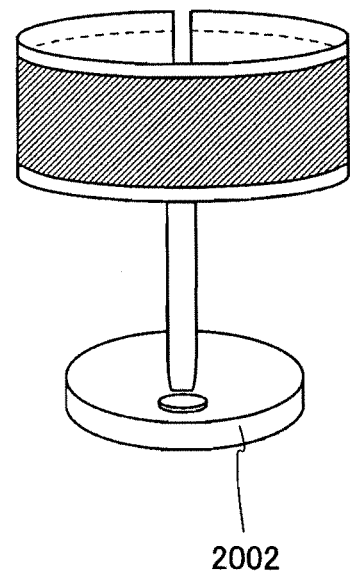

FIGS. 8A and 8B show specific examples of other lighting devices. FIG. 8A shows an example of a desk lamp. FIG. 8B shows an example of a desk lamp including a lighting portion with a curved surface shape. The AD converter according to one embodiment of the present invention or an electronic circuit including the AD converter is included in housings 2001 and 2002, whereby reduction in size and power consumption of the lighting devices can be achieved.

Figure 9:
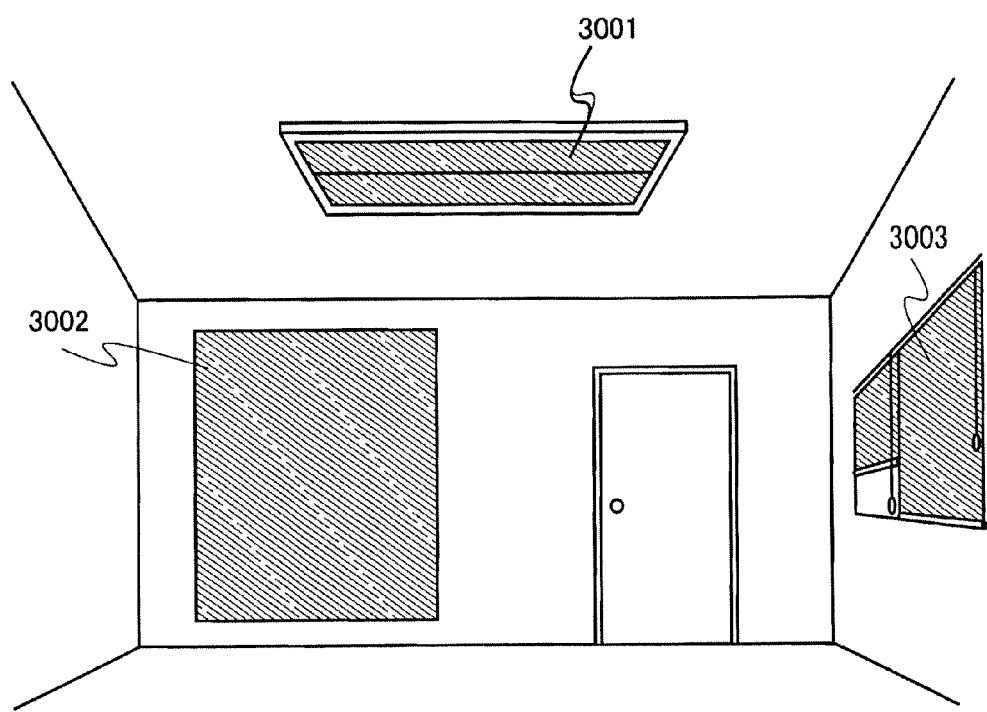
FIG. 9 shows an example of an electronic device.

FIG. 9 shows examples of indoor lighting devices. In FIG. 9, a lighting device (a housing 3001) is installed on the ceiling, and a lighting device (a housing 3002) is installed on (provided on or embedded in) a wall. In addition, a roll-type lighting device (a housing 3003) is provided. The AD converter according to one embodiment of the present invention or an electronic circuit including the AD converter is included in the housings 3001 to 3003, whereby reduction in size and power consumption of the lighting devices can be achieved.

Figure 10:
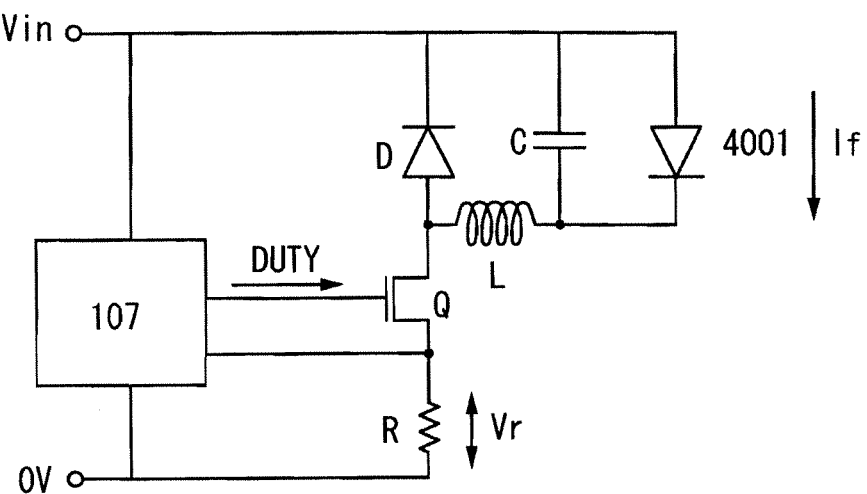
FIG. 10 shows an example of a circuit configuration of an electronic device.

Next, as the above lighting device, a lighting device including a light-emitting diode (LED) element or an electro luminescent (EL) element is described. FIG. 10 shows an example of a step-down lighting circuit (also referred to as an LED driver), which is a modification example of FIG. 5C. The lighting circuit includes a DC-DC converter and a light-emitting element 4001 electrically connected to an output terminal of the DC-DC converter. As the light-emitting element 4001, an LED element or an EL element can be used.

The lighting circuit controls a value of current $I_f$ flowing through the light-emitting element 4001 to be constant. This is because the luminance of the light-emitting element 4001 is proportional to the current $I_f$ flowing through the light-emitting element 4001. First, the current $I_f$ flows to a resistor R, and a voltage $V_r$ is generated. Here, the voltage $V_r$ corresponds a feedback voltage $V_{fb}$ (see FIGS. 5A to 5C). Then, the duty value DUTY is controlled so that the voltage $V_r$ has the same value as the reference voltage in the control circuit 107. As a result, the value of current $I_f$ is controlled, and thus stable current can be supplied to the light-emitting element 4001. The AD converter according to one embodiment of the present invention or an electronic circuit including the AD converter is included in the control circuit 107 of the DC-DC converter, whereby reduction in size and power consumption of the lighting device can be achieved.

This embodiment can be implemented in combination with any of the other embodiments as appropriate.

This application is based on Japanese Patent Application serial no. 2010-186884 and 2011-087839 filed with Japan Patent Office on Aug. 24, 2010 and Apr. 12, 2011, the entire contents of which are hereby incorporated by reference.

The invention claimed is:

1. A semiconductor device comprising:
   a first oscillator configured to output a first frequency in accordance with a reference voltage;
   a second oscillator configured to output a second frequency in accordance with an input voltage;
   a first counter configured to measure the first frequency up to a predetermined counter value M;
   a second counter configured to measure a counter value L of the second frequency in synchronization with the measurement of the first frequency;
   a comparator configured to compare the counter value M and the counter value L and outputting a digital value in accordance with the input voltage; and
   a register configured to control the counter value M.

2. The semiconductor device according to claim 1, wherein the second oscillator is a ring oscillator using the input voltage as a power supply voltage.

3. The semiconductor device according to claim 1, wherein the first oscillator is a ring oscillator using the reference voltage as a power supply voltage.

4. A semiconductor device comprising:
   a conversion circuit comprising an inductor and a switch element; and
   a control circuit comprising a digital integrator, a digital pulse width modulator, and an AD converter, the AD converter comprising:
   a first oscillator configured to output a first frequency in accordance with a reference voltage;
   a second oscillator configured to output a second frequency in accordance with a feedback voltage from the conversion circuit;
   a first counter configured to measure the first frequency;
   a second counter configured to measure the second frequency; and
   a comparator configured to compare a measurement result of the first frequency and a measurement result of the second frequency and outputting a digital value in accordance with the feedback voltage.

5. The semiconductor device according to claim 4, wherein the AD converter outputs the digital value, the digital integrator integrates the digital value and determines a duty value, and the digital pulse width modulator outputs a pulse signal with the duty value.

6. The semiconductor device according to claim 5, wherein the switch element controls a current flowing in the inductor in accordance with the pulse signal, and an output voltage of the conversion circuit is generated in accordance with the current flowing in the inductor.

7. The semiconductor device according to claim 4, wherein the second oscillator is a ring oscillator using the input voltage as a power supply voltage.

8. The semiconductor device according to claim 4, wherein the first oscillator is a ring oscillator using the reference voltage as a power supply voltage.

9. A semiconductor device comprising:
   a conversion circuit comprising an inductor and a switch element; and
   a control circuit comprising a digital integrator, a digital pulse width modulator, and an AD converter, the AD converter comprising:
      a first oscillator configured to output a first frequency in accordance with a reference voltage;
      a second oscillator configured to output a second frequency in accordance with an input voltage;
      a first counter configured to measure the first frequency up to a predetermined counter value M;
      a second counter configured to measure a counter value L of the second frequency in synchronization with the measurement of the first frequency;
      a comparator configured to compare the counter value M and the counter value L and outputting a digital value in accordance with the input voltage; and
      a register configured to control the counter value M.

10. The semiconductor device according to claim 9, wherein the AD converter outputs the digital value, the digital integrator integrates the digital value and determines a duty value, and the digital pulse width modulator outputs a pulse signal with the duty value.

11. The semiconductor device according to claim 10, wherein the switch element controls a current flowing in the inductor in accordance with the pulse signal, and an output voltage of the conversion circuit is generated in accordance with the current flowing in the inductor.

12. The semiconductor device according to claim 9, wherein the second oscillator is a ring oscillator using the input voltage as a power supply voltage.

13. The semiconductor device according to claim 9, wherein the first oscillator is a ring oscillator using the reference voltage as a power supply voltage.

* * * * *